(12) United States Patent
Ura et al.

(10) Patent No.: US 7,374,614 B2
(45) Date of Patent: May 20, 2008

(54) METHOD FOR MANUFACTURING SINGLE CRYSTAL SEMICONDUCTOR

(75) Inventors: Masafumi Ura, Kanagawa (JP); Hidetoshi Kurogi, Kanagawa (JP); Toshiharu Yubitani, Kanagawa (JP); Noboru Furuichi, Kanagawa (JP)

(73) Assignee: Komatsu Denshi Kinzoku Kabushiki Kaisha, Kanagawa (JP)

( * ) Notice: Subject to any disclaimer, the term of this patent is extended or adjusted under 35 U.S.C. 154(b) by 0 days.

(21) Appl. No.: 10/588,750

(22) PCT Filed: Feb. 18, 2005

(86) PCT No.: PCT/JP2005/002627

§ 371 (c)(1),
(2), (4) Date: Aug. 7, 2006

(87) PCT Pub. No.: WO2005/080646

PCT Pub. Date: Sep. 1, 2005

(65) Prior Publication Data

US 2007/0131158 A1    Jun. 14, 2007

(30) Foreign Application Priority Data

Feb. 19, 2004  (JP) ............................. 2004-043211

(51) Int. Cl.
*C30B 15/20*   (2006.01)
(52) U.S. Cl. ............................. 117/30; 117/32; 117/217; 117/218; 117/917
(58) Field of Classification Search .................. 117/13, 117/30, 32, 217, 218, 917
See application file for complete search history.

(56) References Cited

U.S. PATENT DOCUMENTS

| | | | |
|---|---|---|---|
| 5,306,387 | A | 4/1994 | Fusegawa et al. |
| 5,976,246 | A | 11/1999 | Iino et al. |
| 2003/0154906 | A1 | 8/2003 | Weber et al. |

FOREIGN PATENT DOCUMENTS

| | | |
|---|---|---|
| JP | 60-033289 | 2/1985 |
| JP | 60-033291 | 2/1985 |
| JP | 62-260795 | 11/1987 |
| JP | 04-055388 | 2/1992 |
| JP | 07-061893 | 3/1995 |
| JP | 09-263493 | 10/1997 |
| JP | 11-116390 | 4/1999 |
| JP | 2003-246695 | 9/2003 |

*Primary Examiner*—Felisa C Hiteshew
(74) *Attorney, Agent, or Firm*—Gerald T. Shekleton; Welsh & Katz Ltd.

(57) ABSTRACT

The method for manufacturing a single crystal semiconductor achieves an object to reduce the impurity concentration nonuniformity within a semiconductor wafer plane and thus to improve the wafer planarity by introducing an impurity into the single crystal semiconductor more uniformly during the pulling of the single crystal semiconductor from a melt. In the course of pulling the single crystal semiconductor (6), the rotating velocity ($\omega 2$) of the single crystal semiconductor (6) being pulled is adjusted to a predetermined value or higher, and a magnetic field having a strength in a predetermined range is applied to the melt (5). Particularly, the crystal peripheral velocity is adjusted to 0.126 m/sec or higher, and $M/V^{1/3}$ is adjusted to $35.5 \leq M/V^{1/3} \leq 61.3$. More desirably, the crystal peripheral velocity is adjusted to 0.141 m/sec or higher, and $M/V^{1/3}$ is adjusted to $40.3 \leq M/V^{1/3} \leq 56.4$.

18 Claims, 5 Drawing Sheets

| STANDARD No. | CRYSTAL DIAMETER (mm) | MAGNETIC FIELD STRENGTH M (Gauss) | $M/V^{1/3}$ | CRYSTAL ROTATING VELOCITY (rpm) | CRYSTAL PERIPHERAL VELOCITY (m/sec) | RESULT |
|---|---|---|---|---|---|---|
| 1 | 200 | 1497 | 40.4 | 13.5 | 0.141 | ◎ |
| 2 | 300 | 1975 | 40.3 | 10.0 | 0.157 | ◎ |
| 3 | 300 | 2370 | 48.4 | 10.0 | 0.157 | ◎ |
| 4 | 300 | 2765 | 56.4 | 9.0 | 0.141 | ◎ |
| 5 | 200 | 1580 | 42.6 | 13.5 | 0.141 | ○ |
| 6 | 200 | 2079 | 56.1 | 12.0 | 0.126 | ○ |
| 7 | 300 | 1738 | 35.5 | 8.0 | 0.126 | ○ |
| 8 | 300 | 3002 | 61.3 | 10.0 | 0.157 | × |
| 9 | 200 | 582 | 15.7 | 8.0 | 0.084 | × |
| 10 | 200 | 582 | 15.7 | 12.0 | 0.126 | × |
| 11 | 200 | 1247 | 33.6 | 13.5 | 0.141 | × |
| 12 | 200 | 3326 | 89.7 | 13.0 | 0.136 | × |
| 13 | 300 | 1580 | 32.2 | 10.0 | 0.157 | × |
| 14 | 300 | 2370 | 48.4 | 7.0 | 0.110 | × |
| 15 | 300 | 3160 | 64.5 | 8.0 | 0.126 | × |
| 16 | 300 | 3160 | 64.5 | 10.0 | 0.157 | × |

FIG.3

X-RAY PHOTOS OF CRYSTAL CROSS SECTION
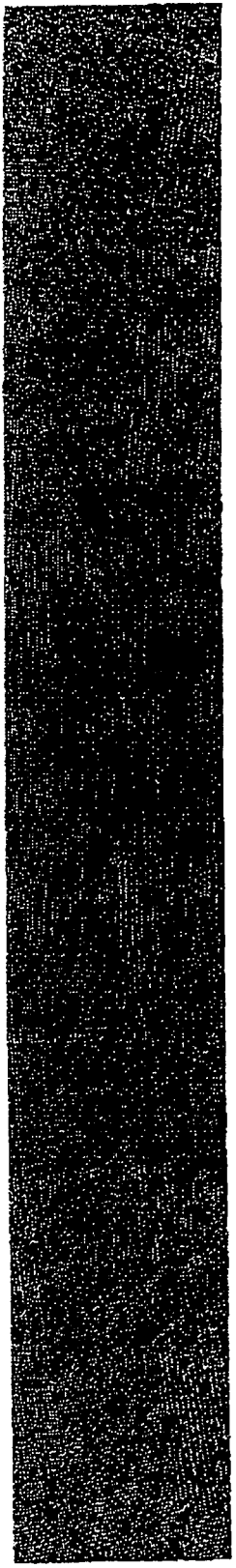
FIG.6(a) DISTANCE BETWEEN GROWTH STRIATIONS IS UNIFORM, ◎
AND STRIATIONS ARE DENSE AND LIGHT.
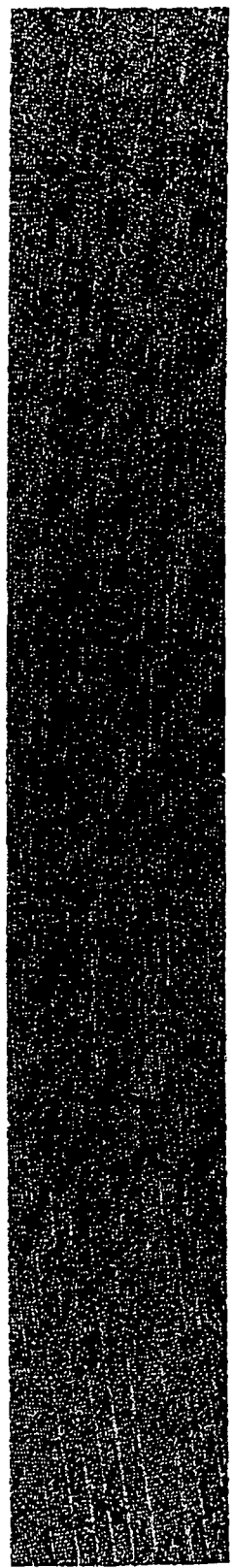
FIG.6(b) DISTANCE BETWEEN GROWTH STRIAITONS ○
IS SOMEWHAT NONUNIFORM.
FIG.6(c) DISTANCE BETWEEN GROWTH STRIAITONS
IS NOT UNIFORM AND STRIATIONS ARE DARK.

ured single crystal silicon such as single crystal
METHOD FOR MANUFACTURING SINGLE CRYSTAL SEMICONDUCTOR This application is a 371 of PCT/JP05/02627 filed Feb. 18, 2005.

TECHNICAL FIELD

The present invention relates to a method for manufacturing a single crystal semiconductor such as single crystal silicon using the CZ method (Czochralski method), and particularly to a method for manufacturing a single crystal semiconductor in such a manner as to obtain a semiconductor wafer having high planarity.

BACKGROUND ART

The CZ method is one of methods for manufacturing a single crystal silicon.

A single crystal silicon (ingot) which has been grown and pulled by the CZ method is sliced, polished and etched to be provided as a silicon wafer for the fabrication of a semiconductor device.

Specifically, the single crystal silicon is pulled from a melt that has been doped with an impurity such as boron B so as to give the silicon wafer a desired resistivity.

In the course of pulling the single crystal silicon, the impurity is not introduced uniformly into the single crystal silicon. Therefore, if a silicon wafer produced from the single crystal silicon (ingot) that has been grown in this manner is cut vertically (perpendicularly to the wafer surface), growth striations corresponding to the impurity concentration nonuniformity are observed and, in the wafer surface, ring-shaped impurity concentration nonuniformity is observed.

Whereas, in recent years, some types of semiconductor devices require demanding specifications for surface planarity of silicon wafers.

As a prior art technique relative to the present invention, the below-mentioned patent document 1 is known.

In this patent document 1, attention is paid to oxygen that is introduced into a single crystal silicon from a quartz crucible via a melt, and the invention disclosed therein is intended to reduce the nonuniformity in oxygen concentration appearing in the surface of a silicon wafer. According to this prior art, the oxygen concentration nonuniformity appearing in the surface of a silicon wafer is reduced by setting the ratio h/d of an overlap length h of a heater slit to an inner diameter of the heater to 0.70 or lower.

Patent document 1: Japanese Patent Application Laid-Open No. 11-116390

DISCLOSURE OF THE INVENTION

Problem to be Solved by the Invention

The present inventors have discovered that the impurity concentration nonuniformity in the surface of a silicon wafer appears as nonuniformity in hardness, which gives an adverse effect to the surface planarity of the wafer. The nonuniformity in hardness is apt to occur particularly when the impurity is added at a high concentration.

Specifically, the addition of an impurity has an effect to harden the crystal. This makes the impurity concentration nonuniformity perceivable as the hardness nonuniformity in the silicon wafer surface. When polished in a polishing process, the silicon wafer exhibits minute unevenness in the surface attributable to the difference in hardness in the wafer surface. When etched in an etching process, the silicon wafer also exhibits minute unevenness in the surface attributable to the concentration nonuniformity in the surface. Such minute unevenness will lead to deterioration in planarity.

The present invention has been achieved in view of the circumstances as described above, and it is an object of the present invention to reduce the impurity concentration nonuniformity in a semiconductor wafer surface and to thereby improve the planarity of the wafer. This object is attained, according to the present invention, by uniformly doping a single crystal semiconductor with an impurity in the course of growing the single crystal semiconductor by pulling the crystal from a melt.

According to the invention described in the patent document 1 mentioned above, the concentration nonuniformity to be reduced in the wafer surface is of oxygen, which is introduced into the single crystal semiconductor from the quartz crucible via the melt. Accordingly, this prior art differs from the present invention in which the concentration nonuniformity to be reduced in the wafer surface is of an impurity (such as boron) which is introduced into the single crystal semiconductor from a melt.

MEANS FOR SOLVING THE PROBLEM

The first aspect of the invention relates to a method for manufacturing a single crystal semiconductor doped with an impurity by immersing a seed crystal in a melt within a crucible and pulling the seed crystal while rotating the same, characterized in that:

in the course of pulling the single crystal semiconductor, a rotating velocity of the single crystal semiconductor being pulled is adjusted to a predetermined value or higher, and a magnetic field having a strength in a predetermined range is applied to the melt.

The second aspect of the invention relates to a method for manufacturing a single crystal semiconductor doped with an impurity by immersing a seed crystal in a melt within a crucible and pulling the seed crystal while rotating the same, characterized in that:

in the course of pulling the single crystal semiconductor, a peripheral velocity at the outer periphery of the single crystal semiconductor being pulled is adjusted to 0.126 m/sec or higher, and a magnetic field is applied to the melt to satisfy the condition:

$$35.5 \leq M/V^{1/3} \leq 61.3$$

where M denotes a magnetic field strength at the bottom of the crucible, and V denotes a volume of the melt within the crucible.

The third aspect of the invention relates to a method for manufacturing a single crystal semiconductor doped with an impurity by immersing a seed crystal in a melt within a crucible and pulling the seed crystal while rotating the same, characterized in that:

in the course of pulling the single crystal semiconductor, a peripheral velocity at the outer periphery of the single crystal semiconductor being pulled is adjusted to 0.126 m/sec or higher.

The fourth aspect of the invention relates to a method for manufacturing a single crystal semiconductor doped with an impurity by immersing a seed crystal in a melt within a crucible and pulling the seed crystal while rotating the same, characterized in that:

a magnetic field is applied to the melt to satisfy the condition:

$$35.5 \leq M/V^{1/3} \leq 61.3$$

where M denotes a magnetic field strength at the bottom of the crucible, and V denotes a volume of the melt within the crucible.

The fifth aspect of the invention relates to a method for manufacturing a single crystal semiconductor doped with an impurity by immersing a seed crystal in a melt within a crucible and pulling the seed crystal while rotating the same, characterized in that:

in the course of pulling the single crystal semiconductor, a peripheral velocity at the outer periphery of the single crystal semiconductor being pulled is adjusted to 0.141 m/sec or higher, and a magnetic field is applied to the melt to satisfy the condition:

$$40.3 \leq M/V^{1/3} \leq 56.4$$

where M denotes a magnetic field strength at the bottom of the crucible, and V denotes a volume of the melt within the crucible.

The sixth aspect of the invention relates to a method for manufacturing a single crystal semiconductor doped with an impurity by immersing a seed crystal in a melt within a crucible and pulling the seed crystal while rotating the same, characterized in that:

in the course of pulling the single crystal semiconductor, a peripheral velocity at the outer periphery of the single crystal semiconductor being pulled is adjusted to 0.141 m/sec or higher.

The seventh aspect of the invention relates to a method for manufacturing a single crystal semiconductor doped with an impurity by immersing a seed crystal in a melt within a crucible and pulling the seed crystal while rotating the same, characterized in that:

a magnetic field is applied to the melt to satisfy the condition:

$$40.3 \leq M/V^{1/3} \leq 56.4$$

where M denotes a magnetic field strength at the bottom of the crucible, and V denotes a volume of the melt within the crucible.

The eighth aspect of the invention relates to the first to the seventh aspects of the invention, characterized in that the impurity added to the single crystal semiconductor is boron B or gallium Ga, the impurity concentration being 8.0E17 atoms/cc or higher.

The ninth aspect of the invention relates to the first to the seventh aspects of the invention, characterized in that the impurity added to the single crystal semiconductor is phosphorus P or antimony Sb or arsenic As, the impurity concentration being 5.0E17 atoms/cc or higher.

The present inventors have assumed that the following reasons are pertinent to why the distance between growth striations as viewed in the cross section perpendicular to the wafer surface is not uniform and ring-shaped impurity concentration nonuniformity is observed in the wafer surface.

1) Nonuniform flow is formed in convection of melt 5 during pulling of a single crystal silicon 6, which varies the concentration of an impurity introduced into the single crystal silicon 6 from the melt 5.

2) Rotation of the single crystal silicon 6 during the growth thereof causes difference in temperature, resulting in remelting (the crystal that has been hardened resumes the liquid state), which varies the concentration of an impurity introduced into the single crystal silicon 6 from the melt 5.

3) The gradient at the growth interface (solid-liquid interface) between the single crystal silicon 6 and the melt 5 is sharp, and thus growth striations (indicating the presence of impurity concentration nonuniformity) are observed across the growth interface when viewed in the vertical section of the wafer.

Therefore, the present inventors have assumed that the following points are important to uniformize the distance between growth striations as viewed in the section vertical to the wafer surface (while making the growth striations dense and light), and to reduce the ring-shaped impurity concentration nonuniformity in the wafer surface.

4) The impurity concentration in the melt 5 is made uniform near the growth interface (solid-liquid interface).

5) The temperature near the growth interface (solid-liquid interface) is stabilized by inhibiting the convection of the melt 5 to prevent the occurrence of remelting.

6) The temperature distribution in the surface of the melt 5 is made symmetrical to prevent the occurrence of remelting.

7) An assumption has been made that, in order to achieve the object 4) above, the rotating velocity ω2 of the single crystal silicon 6 must be adjusted to a predetermined value or higher, in the course of pulling the single crystal silicon 6.

8) Another assumption has been made that, in order to achieve the objects 5) and 6) above, a magnetic field having a strength in a predetermined range must be applied to the melt 5.

Experiments were conducted to examine the assumptions as described above, and the results as shown in FIG. 4 were obtained, proving the correctness of the assumptions.

Specifically, according to the first aspect of the invention, the impurity concentration nonuniformity in the single crystal semiconductor 6 can be reduced by adjusting rotating velocity ω2 of the single crystal semiconductor 6, in the course of pulling the same, to a predetermined value or higher and a magnetic field having a strength in a predetermined range is applied to the melt.

According to the second aspect of the invention, the impurity concentration nonuniformity in the single crystal semiconductor 6 could be reduced by adjusting the rotating velocity ω2 of the single crystal semiconductor 6, in the course of pulling the same, to 0.126 m/sec or higher and adjusting $M/V^{1/3}$ to satisfy the condition $35.5 \leq M/V^{1/3} \leq 61.3$ (the region enclosed by the broken lines in FIG. 4).

When considering only the crystal peripheral velocity, the crystal peripheral velocity may be adjusted to 0.126 m/sec or higher in order to reduce the impurity concentration nonuniformity (the third aspect of the invention).

When considering only $M/V^{1/3}$, $M/V^{1/3}$ may be adjusted to satisfy the condition $35.5 \leq M/V^{1/3} \leq 61.3$ in order to reduce the impurity concentration nonuniformity (the fourth aspect of the invention).

According to the fifth aspect of the invention, the impurity concentration nonuniformity in the single crystal semiconductor 6 could be reduced by adjusting the crystal peripheral velocity of the single crystal semiconductor 6, in the course of pulling the same, to 0.141 m/sec or higher and adjusting $M/V^{1/3}$ to satisfy the condition $40.3 \leq M/V^{1/3} \leq 56.4$ (the region enclosed by the thick solid lines in FIG. 4).

When considering only the crystal peripheral velocity, the crystal peripheral velocity may be adjusted to 0.141 m/sec or higher in order to reduce the impurity concentration nonuniformity (the sixth aspect of the invention).

When considering only $M/V^{1/3}$, $M/V^{1/3}$ may be adjusted to satisfy the condition $40.3 \leq M/V^{1/3} \leq 56.4$ in order to reduce the impurity concentration nonuniformity impurity concentration nonuniformity (the seventh aspect of the invention).

According to the present invention, the impurity concentration nonuniformity is reduced, which in turn reduces the nonuniformity in hardness in the semiconductor wafer surface. Therefore, when the semiconductor wafer surface is subjected to polishing or etching processing, the minute unevenness attributable to the concentration nonuniformity is eliminated (or minimized), and thus the planarity after the processing is improved relative to the prior arts.

It is believed that the impurity concentration nonuniformity causes an effect to the planarity when the impurity is added at a concentration high enough to provide an effect of hardening the crystal.

Therefore, when boron B or gallium Ga is used as the impurity, the impurity is desirably added at a high concentration of 8.0E17 atoms/cc or more (the eighth aspect of the invention).

When phosphorus P, antimony Sb, or arsenic As is used as the impurity, the impurity is desirably added at a high concentration of 5.0E17 atoms/cc or more (the ninth aspect of the invention).

According to the present invention, however, the impurity concentration nonuniformity in the silicon wafer can be reduced by adjusting the crystal peripheral velocity and $M/V^{1/3}$ to the conditions as described above, regardless of the magnitude of impurity concentration. Accordingly, the present invention can be embodied without being limited to the high concentrations specified in the eighth and ninth aspects of the invention.

Further, the present invention is also applicable to pull a single crystal semiconductor of other than silicon, of gallium arsenide, for example.

BRIEF DESCRIPTION OF THE DRAWINGS

FIG. 3 is a table showing the results of experiments conducted by pulling a single crystal silicon while changing the conditions for each standard and evaluating the impurity concentration nonuniformity in the respective silicon wafers;

FIGS. 6(a), 6(b), and 6(c) are photographs showing growth striations appearing in the vertical sections of silicon wafers for respective evaluations of the silicon wafer concentration nonuniformity.

BEST MODE FOR CARRYING OUT THE INVENTION

An apparatus according to an embodiment of the present invention will be described with reference to the drawings.

Figure 1:
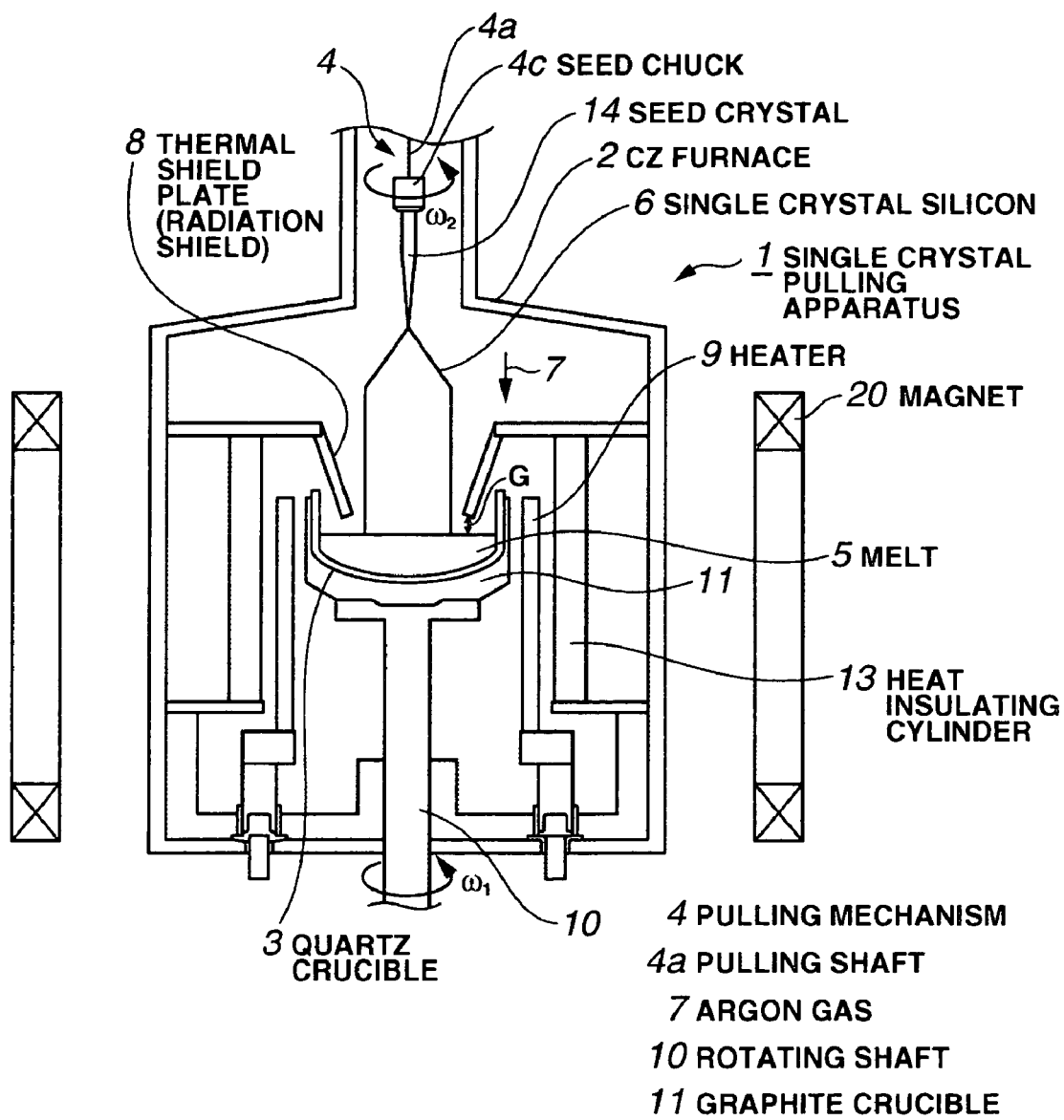
FIG. 1 is a drawing illustrating a crystal pulling apparatus according to an embodiment of the invention.

FIG. 1 is a side view showing the configuration of the embodiment apparatus.

As shown in FIG. 1, the crystal pulling apparatus 1 of the embodiment has a CZ furnace (chamber) 2 used as a vessel for pulling a single crystal. The crystal pulling apparatus 1 shown in FIG. 1 is suitable for manufacturing a single crystal silicon ingot 6 having a diameter of 200 mm to 300 mm, for example.

The CZ furnace 2 is provided therein with a quartz crucible 3 in which a polycrystalline silicon material is molten and held as melt 5. About 300 kg of polycrystalline silicon is required to be charged in the quartz crucible 3 in order to pull a single crystal silicon having a diameter of 300 mm. The outside of the quartz crucible 3 is enclosed by a graphite crucible 11. A cylindrical heater 9 is provided on the lateral outside of the quartz crucible 3 to heat and melt the polycrystalline silicon material in the quartz crucible 3. The output of the heater 9 (power kW) is controlled to adjust the heat quantity applied to the melt 5. For example, the temperature of the melt 5 is detected, and the output of the heater 9 is controlled by using the detected temperature as a feedback quantity such that the temperature of the melt 5 becomes a target temperature.

Although the melt 5 is externally heated by using the heater 9 according to the embodiment, the heating means is not limited to the heater but may be any other heating means. For example, the electromagnetic heating or laser irradiation heating may be employed as the heating means.

A heat insulating cylinder 13 is provided between the heater 9 and the inner wall of the CZ furnace 2.

A pulling mechanism 4 is provided above the quartz crucible 3. The pulling mechanism 4 includes a pulling shaft 4a and a seed chuck 4c at the tip of the pulling shaft 4a. The seed chuck 4c holds a seed crystal 14. The pulling shaft 4a used herein may be a shaft to pull up or wire to hoist the seed crystal 14.

The polycrystalline silicon (Si) is heated and molten within the quartz crucible 3. Once the temperature of the melt 5 is stabilized, the pulling mechanism 4 is activated to pull up the single crystal silicon 6 (single crystal silicon ingot) from the melt 5. Specifically, the pulling shaft 4a is lowered so that the seed crystal 14 held by the seed chuck 4c at the tip of the pulling shaft 4a is immersed in the melt 5. After the seed crystal 14 is sufficiently immersed in the melt 5, the pulling shaft 4a is raised. A single crystal silicon grows as the seed crystal 14 held by the seed chuck 4c ascends. The quartz crucible 3 is rotated by a rotating shaft 10 at a rotating velocity ω1 (0.1 to 0.2 rpm, for example) during the pulling. The pulling shaft 4a of the pulling mechanism 4 is rotated in the same direction as the rotating shaft 10 at a rotating velocity ω2.

The rotating shaft 10 can also be driven vertically to move the quartz crucible 3 vertically to a position as required.

The interior of the furnace 2 is kept at vacuum (at about 20 Torr, for example) by shielding the interior of the CZ furnace 2 from the outside air. Specifically, argon gas 7 is supplied into the CZ furnace 2 as an inert gas and discharged from an exhaust port of the CZ furnace 2 by a pump. The interior pressure of the furnace 2 is thus reduced to a predetermined pressure.

Various evaporated substances are produced within the CZ furnace 2 during the process (during one batch) of pulling a single crystal. Therefore, the argon gas 7 is supplied into the CZ furnace 2 and discharged out of the CZ furnace 2 together with the evaporated substances, whereby the evaporated substances is removed from the CZ furnace 2 and the inside of the CZ furnace 2 is cleaned. The quantity of the argon gas 7 to be supplied is set for each process in one batch.

The quantity of the melt 5 is decreased as the single crystal silicon 6 is pulled. Along with the decrease of the melt 5, the contact area between the melt 5 and the quartz crucible 3 changes, which changes the quantity of oxygen that melts into the melt 5 from the quartz crucible 3. This change affects the oxygen concentration distribution in the single crystal silicon 6 which is pulled up. In order to prevent this, the polycrystalline silicon material or single crystal silicon material may be additionally supplied into the quartz crucible 3 the melt 5 of which has been decreased, after or during the pulling.

A thermal shield plate 8 (gas rectifier tube, radiation shield) having a substantially inversed truncated cone shape is provided to surround the single crystal silicon 6 above the quartz crucible 3. The thermal shield plate 8 is supported by the heat insulating cylinder 13. The thermal shield plate 8 introduces the argon gas 7, which has been supplied as a carrier gas into the CZ furnace 2 from above, to the center of the melt surface 5a and then to the peripheral edge of the melt surface 5a, passing the gas over the melt surface 5a. The argon gas 7 is then discharged through an exhaust port provided in a lower part of the CZ furnace 2, together with other gases evaporated from the melt 5. This makes it possible to stabilize the gas flow velocity on the melt surface and hence to keep the condition of oxygen evaporated from the melt 5 stable.

The thermal shield plate 8 serving as a radiation shield thermally insulates and shields the seed crystal 14 and the single crystal silicon 6 grown from the seed crystal 14, against radiation heat generated by the quartz crucible 3, the melt 5, the heater 9, and other high-temperature components. The thermal shield plate 8 also prevents an impurity (such as silicon oxide) produced in the furnace from being deposited on the single crystal silicon to inhibit the growth of the single crystal. The size of a gap G between the lower end of the thermal shield plate 8 and the melt surface 5a can be adjusted by raising or lowering the rotating shaft 10 to change the vertical position of the quartz crucible 3. Alternatively, the gap G may be adjusted by vertically moving the thermal shield plate 8 by an elevator.

A magnet 20 is provided to surround the outside of the furnace 2 to apply a magnetic field (horizontal magnetic field) to the melt 5 in the quartz crucible 3.

The present inventors have assumed that the following may be the reasons why the distances between the growth striations as viewed by cutting the crystal perpendicularly to the wafer surface are not uniform and the wafer surface exhibits ring-shaped impurity concentration nonuniformity.

1) Nonuniform flow is formed in the convection of the melt 5 during pulling of the single crystal silicon 6, whereby the concentration of the impurity introduced into the single crystal silicon 6 from the melt 5 is varied.

2) The rotation of the single crystal silicon 6 during growth thereof causes temperature difference in the single crystal silicon 6, which causes the remelting (the crystal that has been hardened returns to the liquid state). This varies the concentration of the impurity introduced into the single crystal silicon 6 from the melt 5.

3) The gradient at the growth interface (solid-liquid interface) between the single crystal silicon 6 and the melt 5 is sharp, and thus growth striations (indicating the presence of impurity concentration nonuniformity) across the growth interface are observed when viewed in the vertical section of the wafer.

Consequently, the present inventors have considered that the following points are important to uniformize the distance between the growth striations as viewed when cutting the crystal to the wafer surface perpendicularly to the wafer surface (while making the growth striations dense and light), and to reduce (or nullify) the ring-shaped impurity concentration nonuniformity in the wafer surface.

4) The impurity in the melt 5 should be uniformized near the growth interface (solid-liquid interface).

5) The convection of the melt 5 should be inhibited to stabilize the temperature near the growth interface (solid-liquid interface) to prevent the occurrence of remelting.

6) The temperature distribution at the surface of the melt 5 should be made symmetrical to prevent the occurrence of remelting.

7) In order to achieve the object 4) above, it has assumed been that, in the course of pulling a single crystal silicon 6, the rotating velocity $\omega 2$ of the single crystal silicon 6 that is pulled must be set to a predetermined value or higher.

8) In order to achieve the objects 5) and 6), it has been assumed that a magnetic field having a strength in a predetermined range must be applied to the melt 5.

A description will now be made on experiments conducted using the crystal pulling apparatus 1 shown in FIG. 1 on the basis of the assumptions 7) and 8) above.

FIG. 3 is a table showing the results of evaluation of impurity concentration nonuniformity in the wafer surface (growth striations as viewed in the vertical section of the wafer). The evaluation was performed using the X-ray topography method, for example, for a silicon wafer that had been obtained by pulling a single crystal silicon 6 and slicing the single crystal silicon ingot 6, while changing various conditions, namely, the crystal diameter (the diameter of the single crystal silicon ingot 6 at its straight body portion), the magnetic field strength M (Gauss), $M/V^{1/3}$ (in which M denotes a magnetic field strength, and V denotes a volume of the melt 5), the crystal rotation velocity $\omega 2$ (rpm), and the crystal peripheral velocity (m/sec) for the respective standards 1 to 16. The evaluation results are represented in the table by the symbols of a double circle, a circle, and a cross. The double circle denotes that "no impurity concentration nonuniformity is observed", the circle denotes that "little impurity concentration nonuniformity is observed", and the cross denotes that "impurity concentration nonuniformity is observed".

The evaluations were conducted on crystals with crystal diameters of 200 mm and 300 mm. Boron B was used as the impurity, and adjustment was made so that the impurity was introduced into the single crystal silicon 6 at a concentration in the range of 1E18 atoms/cc to 1E19 atoms/cc.

Figure 2:
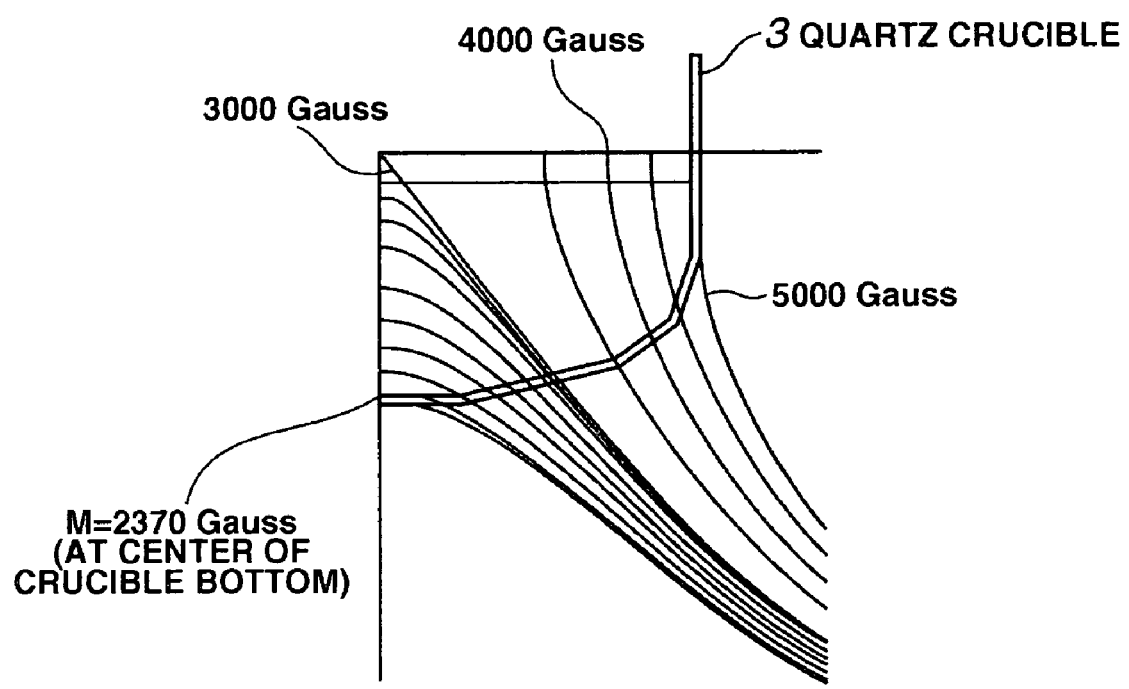
FIG. 2 is a drawing illustrating the magnetic field strength distribution in various parts in a melt (in a quartz crucible)

The magnetic field strength M is a magnetic field strength at the center of the bottom of the quartz crucible 3, as shown in FIG. 2. The magnetic field strength differs among various positions in the melt 5 (quartz crucible 3), as shown in FIG. 2, when a magnetic field (horizontal magnetic field) is applied to the melt 5 by the magnet 20. Therefore, the magnetic field strength M at the center of the bottom of the quartz crucible 3 is employed as the representative value.

The term "crystal peripheral velocity" means a peripheral velocity at the outer periphery of the single crystal silicon 6 being pulled (the outer periphery of the straight body portion of the single crystal silicon ingot).

In the table of FIG. 3, the crystal peripheral velocity is employed as one of the parameters in addition to the crystal rotation velocity $\omega 2$ for the reason as follows.

While the rotation of the single crystal silicon 6 has an effect to uniformize the impurity in the melt 5 near the growth interface (solid-liquid interface), this effect differs depending on the difference in crystal diameter (depending on, for example, whether the crystal diameter is 200 mm or 300 mm). Therefore, in order to obtain generalized indexes of the effect of eliminating the impurity concentration nonuniformity not depending on the size of the crystal diameter but depending on the crystal rotation velocity ω2, the parameter of crystal peripheral velocity is employed as a rotating velocity not depending on the crystal diameter.

Further, in the table of FIG. 3 described above, the parameter of $M/V^{1/3}$ is employed as one of the parameters in addition to the magnetic field strength M for the reason as follows.

The effect of inhibiting convection of the melt 5 by the application of the magnetic field differs depending on the quantity of the melt 5. Therefore, in order to obtain generalized indexes of the effect of eliminating the impurity concentration nonuniformity by the magnetic field M not depending on the size (volume V) of the melt 5, the parameter of $M/V^{1/3}$ is employed as a magnetic field strength value not depending on the size (volume V) of the melt 5. The volume V of the melt is raised to the power of ⅓ in order to convert the three-dimensional quantity (volume) of the melt into a one-dimensional representative length.

Figure 4:
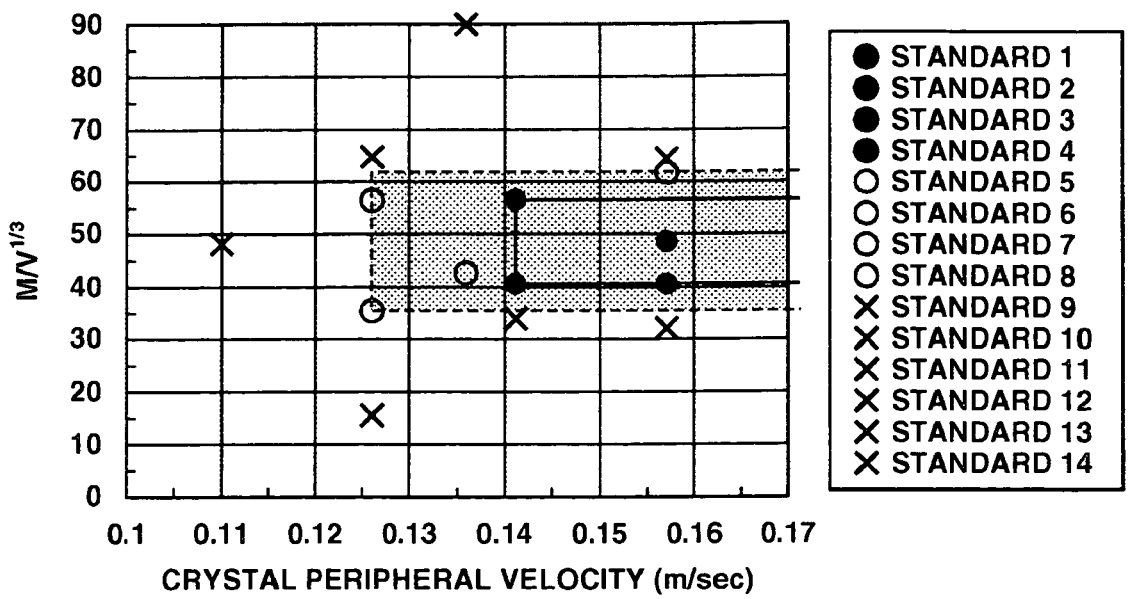
FIG. 4 is a graph illustrating the experimental results shown in FIG. 3, the crystal peripheral velocities being plotted on the abscissa axis and the values of $M/V^{1/3}$ being plotted on the ordinate axis.

The results of the experiments conducted for the standards 1 to 16 shown in FIG. 3 are shown in a graph of FIG. 4, in which the crystal peripheral velocities (m/sec) are plotted along the abscissa axis and $M/V^{1/3}$ along the ordinate axis.

In FIG. 4, the range corresponding to the evaluation "little impurity concentration nonuniformity is observed" (represented by the circle symbol) is enclosed by broken lines, and the range corresponding to the evaluation "no impurity concentration nonuniformity is observed" (represented y the double circle symbol) is enclosed by the thick solid lines. As seen from FIG. 4, the conditions required to obtain the evaluation "little impurity concentration nonuniformity is observed" (represented by the circle symbol) were crystal peripheral velocities of 0.126 m/sec or higher and $M/V^{1/3}$ of $35.5 \leq M/V^{1/3} \leq 61.3$.

The conditions required to obtain the evaluation "no impurity concentration nonuniformity is observed" (represented by the double circle symbol) were crystal peripheral velocities of 0.141 m/sec or higher and $M/V^{1/3}$ of $40.3 \leq M/V^{1/3} \leq 56.4$.

If only the crystal peripheral velocity is considered to reduce the impurity concentration nonuniformity, the crystal peripheral velocity should be adjusted to 0.126 m/sec or higher (see the broken line in FIG. 4), and more desirably to 0.141 m/sec or higher (see the thick solid line in FIG. 4).

Further, if only $M/V^{1/3}$ is considered to reduce the impurity concentration nonuniformity, $M/V^{1/3}$ should be adjusted to the range of $35.5 \leq M/V^{1/3} \leq 61.3$ (see the broken line in FIG. 4), and more desirably to $40.3 \leq M/V^{1/3} \leq 56.4$ (see the thick solid line in FIG. 4).

A single crystal silicon 6 was actually pulled under the conditions as described above, and the single crystal silicon 6 thus grown was sliced to obtain a silicon wafer. The impurity concentration nonuniformity in the silicon wafer (growth striations in the vertical section) was measured to ascertain that little or no impurity concentration nonuniformity was observed.

It is believed, in view of the conditions described above, that the impurity concentration in the melt 5 directly below the growth interface (solid-liquid interface) was uniformized by increasing the crystal rotation velocity ω2 to adjust the same to a high crystal peripheral velocity of 0.126 m/sec or higher (desirably, 0.141 m/sec or higher), and this contributed to the reduction of impurity concentration nonuniformity.

It is also believed that the convection of the melt 5 near the growth interface (solid-liquid interface) was inhibited and thus the temperature variation was suppressed by applying a magnetic field having a predetermined strength or more to the melt 5 by means of the magnet 20 to adjust the magnetic field high with $M/V^{1/3}$ of 35.5 or more (desirably, 40.3 or more), and this contributed to the reduction of the impurity concentration nonuniformity.

However, it is believed that a too strong magnetic field strength will cause problems as described below.

Figure 5:
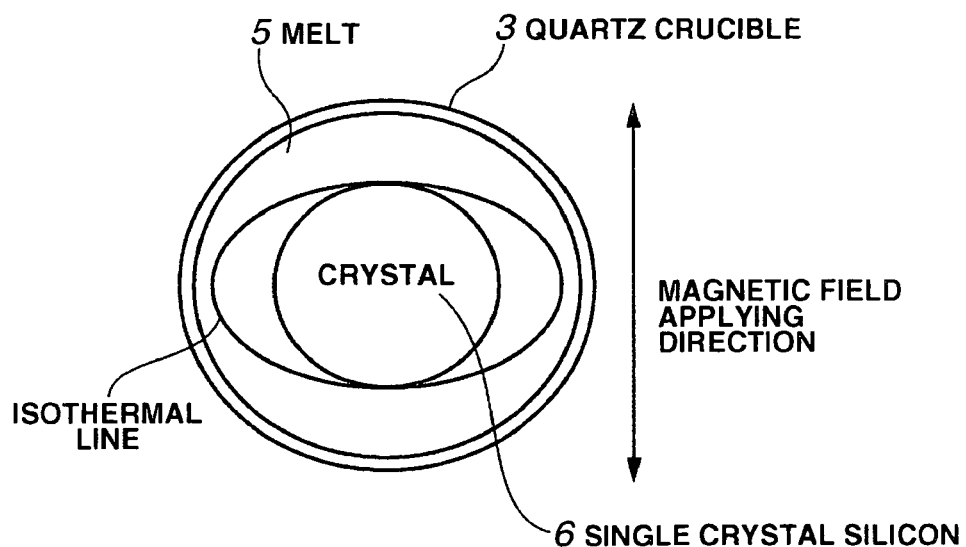
FIG. 5 is a top view of a quartz crucible, illustrating how the temperature distribution is made asymmetric by a high magnetic field.

FIG. 5 is a top view of the quartz crucible 3, showing an isothermal line in the surface of the melt 5. It is assumed that the magnetic field is applied in the upward and downward directions as viewed in FIG. 5. The effect to reduce the temperature gradient in the melt 5 by inhibiting the convection of the melt 5 is exhibited in the transverse direction (as viewed in FIG. 5) perpendicular to the direction of application of the magnetic field. Since the convection vertical to the direction of application of the magnetic field is inhibited, the temperature gradient becomes great. In the direction parallel to the direction of application of the magnetic field, the temperature gradient becomes smaller than that in the direction vertical to the direction of application of the magnetic field, since the convection is not inhibited in this direction. Therefore, if the magnetic field strength is too high, the temperature distribution in the melt 5 will assume an asymmetric elliptical shape, and the isothermal line will form a transversely elongated elliptical shape as shown in FIG. 5. Therefore, if the magnetic field strength is too high, the temperature distribution in the melt 5 becomes nonuniform near the growth interface (solid-liquid interface) to cause remelting. This will increase the impurity concentration nonuniformity.

Therefore, an upper limit should be set for the magnetic field strength. Specifically, the magnetic field strength should be adjusted to $M/V^{1/3}$ of 61.3 or less (desirably, 56.4 or less) when the magnet 20 is used to apply a magnetic field to the melt 5. It is believed that such adjustment of the magnetic field will contribute to the reduction of the impurity concentration nonuniformity.

FIGS. 6(a), 6(b), 6(c) each shows the result of measuring the growth striations in a vertical section of a silicon wafer by using the X-ray topography method.

FIG. 6(a) shows a photo of a vertical section of a silicon wafer which has been evaluated as "no impurity concentration nonuniformity is observed" (represented by the double circle simple). FIG. 6(b) shows a photo of a vertical section of a silicon wafer which has been evaluated as "little impurity concentration nonuniformity is observed" (represented by the circle symbol). FIG. 6(c) shows a photo of a vertical section of a silicon wafer which has been evaluated as "impurity concentration nonuniformity is observed" (represented by the cross symbol).

As seen from FIG. 6(a), the distance between the growth striations is uniform in the vertical section of the silicon wafer, and the growth striations are dense and light. This is the reason for the evaluation that "no impurity concentration nonuniformity is observed".

As seen from FIG. 6(b), the distance between the growth striations is somewhat nonuniform in the vertical section of the silicon wafer, and this is the reason of the evaluation that "little impurity concentration nonuniformity is observed".

As seen from FIG. 6(c), the distance between the growth striations is not uniform in the vertical section of the silicon wafer, and the growth striations are dark. This is the reason of the evaluation that "impurity concentration nonuniformity is observed".

The planarity of the surface of the silicon wafer observed in FIG. 6(a) or FIG. 6(b) was measured after processing it by a polishing or etching process. As a result, a very high planarity was obtained. This silicon wafer was used to fabricate a semiconductor device. The product thus obtained showed a very high yield.

The above description of the embodiment has been made for the case in which boron B is used as the impurity. However, instead of boron B, gallium Ga, phosphorus P, antimony Sb, or arsenic As may be used as the impurity to obtain equivalent effects to those of boron B.

Consideration will now be made on the magnitude of concentration of the impurity added to the single crystal silicon 6.

It is believed that the impurity concentration nonuniformity causes an effect to the planarity when the impurity is added at a concentration high enough to obtain an effect of hardening the crystal.

Therefore, when boron B or gallium Ga is used as the impurity, the impurity is desirably added at a high concentration of 8.0E17 atoms/cc or more.

When phosphorus P, antimony Sb, or arsenic As is used as the impurity, the impurity is desirably added at a high concentration of 5.0E17 atoms/cc or more.

According to the present invention, however, the impurity concentration nonuniformity in the silicon wafer can be reduced by adjusting the crystal peripheral velocity and $M/V^{1/3}$ to the conditions as described above, regardless of the magnitude of impurity concentration. Accordingly, the present invention can be embodied without being limited to the high concentrations above.

Although the present embodiment has been described on the assumption that a horizontal magnetic field is applied to the melt 5, a cusped magnetic field may be applied to the melt 5.

According to the present embodiment, necking processing may be performed or may not be performed during the pulling of the single crystal silicon 6. In particular, the present invention can be applied without performing the necking processing if an impurity is added to the seed crystal 14 at a concentration equivalent to that of the concentration of the impurity added to the melt 5.

Although the present embodiment has been described on the case in which the single crystal silicon 6 is pulled by the use of the crystal pulling apparatus 1 having a single heater 9 provided on the side of the quartz crucible 3, the present invention is of course applicable to the case in which the single crystal silicon is pulled by the use of a crystal pulling apparatus having multiple heaters, namely a plurality of side heaters provided along the vertical direction on the side of the quartz crucible 3, or a crystal pulling apparatus having a side heater provided on the side and a bottom heater provided on the bottom of the quartz crucible 3.

INDUSTRIAL APPLICABILITY

The present invention is also applicable to pulling a single crystal semiconductor of other than silicon, of gallium arsenide, for example.

The invention claimed is:

1. A method for manufacturing a single crystal semiconductor doped with an impurity by immersing a seed crystal in a melt within a crucible and pulling the seed crystal while rotating the same, comprising:

in the course of pulling the single crystal semiconductor, adjusting a rotating velocity of the single crystal semiconductor being pulled to a predetermined value or higher, and controlling a ratio of M to V where M denotes a magnetic field strength applied to the melt and V denotes a volume of the melt, thereby distributing the impurities in a uniform fashion.

2. A method for manufacturing a single crystal semiconductor doped with an impurity by immersing a seed crystal in a melt within a crucible and pulling the seed crystal while rotating the same, comprising:

in the course of pulling the single crystal semiconductor, adjusting a peripheral velocity at the outer periphery of the single crystal semiconductor being pulled to 0.126 m/sec or higher, and applying a magnetic field to the melt to satisfy the condition:

$$35.5 \leq M/V^{1/3} \leq 61.3$$

Where M denotes a magnetic field strength at the bottom of the crucible, and V denotes a volume of the melt within the crucible.

3. The method for manufacturing a single crystal semiconductor according to claim 2, wherein the impurity added to the single crystal semiconductor is boron B or gallium Ga, the impurity concentration being 8.0E17 atoms/cc or higher.

4. The method for manufacturing a single crystal semiconductor according to claim 2, wherein the impurity added to the single crystal semiconductor is phosphorus P or antimony Sb or arsenic As, the impurity concentration being 5.0E17 atoms/cc or higher.

5. A method for manufacturing a single crystal semiconductor doped with an impurity by immersing a seed crystal in a melt within a crucible and pulling the seed crystal while rotating the same, comprising:

applying a magnetic field to the melt to satisfy the condition:

$$35.5 M/V^{1/3} \leq 61.3$$

where M denotes a magnetic field strength at the bottom of the crucible, and V denotes a volume of the melt within the crucible.

6. The method for manufacturing a single semiconductor according to claim 5, wherein the impurity added to the single crystal semiconductor is boron B or gallium Ga, the impurity concentration being 8.0E17 atoms/cc or higher.

7. The method for manufacturing a single semiconductor according to claim 5, wherein the impurity added to the single crystal semiconductor is phosphorus P or antimony Sb or arsenic As, the impurity concentration being 5.0E17 atoms/cc or higher.

8. A method for manufacturing a single crystal semiconductor doped with an impurity by immersing a seed crystal in a melt within a crucible and pulling the seed crystal while rotating the same, in that comprising:

in the course of pulling the single crystal semiconductor, adjusting a peripheral velocity at the outer periphery of the single crystal semiconductor being pulled to 0.141 m/sec or higher and, applying a magnetic field to the melt to satisfy the condition:

$$40.3 \leq M/V^{1/3} \leq 56.4$$

where M denotes a magnetic field strength at the bottom of the crucible, and V denotes a volume of the melt within the crucible.

9. The method for manufacturing a single semiconductor according to claim 8, characterized in that wherein the impurity added to the single crystal semiconductor is boron B or gallium Ga, the impurity concentration being 8.0E17 atoms/cc or higher.

10. The method for manufacturing a single semiconductor according to claim 8, wherein the impurity added to the single crystal semiconductor is phosphorus P or antimony Sb or arsenic As, the impurity concentration being 5.0E17 atoms/cc or higher.

11. A method for manufacturing a single crystal semiconductor doped with an impurity by immersing a seed crystal in a melt within a crucible and pulling the seed crystal while rotating the same, characterized in that:

in the course of pulling the single crystal semiconductor, a peripheral velocity at the outer periphery of the single crystal semiconductor being pulled is adjusted to 0.141 m/sec or higher.

12. A method for manufacturing a single crystal semiconductor doped with an impurity by immersing a seed crystal in a melt within a crucible and pulling the seed crystal while rotating the same, characterized in that:

a magnetic field is applied to the melt to satisfy the condition:

$$40.3 \leq M/V^{1/3} \leq 56.4$$

where M denotes a magnetic field strength at the bottom of the crucible, and V denotes a volume of the melt within the crucible.

13. The method for manufacturing a single semiconductor according to claim 12, wherein the impurity added to the single crystal semiconductor is boron B or gallium Ga, the impurity concentration being 8.0E17 atoms/cc or higher.

14. The method for manufacturing a single semiconductor according to claim 12, wherein the impurity added to the single crystal semiconductor is phosphorus P or antimony Sb or arsenic As, the impurity concentration being 5.0E17 atoms/cc or higher.

15. A method for manufacturing a single crystal semiconductor doped with an impurity by immersing a seed crystal in a melt within a crucible and pulling the seed crystal while rotating the same, comprising:

in the course of pulling the single crystal semiconductor, adjusting a peripheral velocity at the outer periphery of the single crystal semiconductor being pulled to 0.126 m/sec or higher, wherein:

the impurity added to the single crystal semiconductor is boron B or gallium Ga, the impurity concentration being 8.0E17 atoms/cc or higher.

16. A method for manufacturing a single crystal semiconductor, doped with an impurity by immersing a seed crystal in a melt within a crucible and pulling the seed crystal while rotating the same, comprising:

in the course of pulling the single crystal semiconductor, adjusting a peripheral velocity at the outer periphery of the single crystal semiconductor being pulled to 0.126 m/sec or higher, wherein:

the impurity added to the single crystal semiconductor is phosphorus P or antimony Sb or arsenic As, the impurity concentration being 5.0E17 atoms/cc or higher.

17. A method for manufacturing a single crystal semiconductor doped with an impurity by immersing a seed crystal in a melt within a crucible and pulling the seed crystal while rotating the same comprising:

in the course of pulling the single crystal semiconductor, adjusting a peripheral velocity at the outer periphery of the single crystal semiconductor being pulled to 0.141 m/sec or higher, wherein:

the impurity added to the single crystal semiconductor is boron B or gallium Ga, the impurity concentration being 8.0E17 atoms/cc or higher.

18. A method for manufacturing a single crystal semiconductor doped with an impurity by immersing a seed crystal in a melt within a crucible and pulling the seed crystal while rotating the same comprising:

in the course of pulling the single crystal semiconductor, adjusting a peripheral velocity at the outer periphery of the single crystal semiconductor being pulled to 0.141 m/sec or higher, wherein:

the impurity added to the single crystal semiconductor is phosphorus P or antimony Sb or arsenic As, the impurity concentration being 5.0E17 atoms/cc or higher.

* * * * *